United States Patent
Rick et al.

(10) Patent No.: US 9,805,993 B2
(45) Date of Patent: Oct. 31, 2017

(54) DEVICE FOR DETERMINING THE TEMPERATURE OF A SUBSTRATE

(71) Applicants: CENTROTHERM THERMAL SOLUTIONS GMBH & CO. KG, Blaubeuren (DE); HQ-DIELECTRICS GMBH, Dornstadt (DE)

(72) Inventors: Hartmut Rick, Dornstadt (DE); Wilfried Lerch, Dornstadt (DE); Jürgen Niess, Sontheim (DE)

(73) Assignee: HQ-DIELECTRICS GMBH (DE)

( * ) Notice: Subject to any disclaimer, the term of this patent is extended or adjusted under 35 U.S.C. 154(b) by 398 days.

(21) Appl. No.: 14/384,223

(22) PCT Filed: Mar. 15, 2013

(86) PCT No.: PCT/EP2013/000807
§ 371 (c)(1),
(2) Date: Sep. 10, 2014

(87) PCT Pub. No.: WO2013/135394
PCT Pub. Date: Sep. 19, 2013

(65) Prior Publication Data
US 2015/0087085 A1   Mar. 26, 2015

(30) Foreign Application Priority Data

Mar. 16, 2012   (DE) .................. 10 2012 005 428

(51) Int. Cl.
*H01L 21/66*   (2006.01)
*H01L 21/67*   (2006.01)
(Continued)

(52) U.S. Cl.
CPC ............ *H01L 22/10* (2013.01); *G01J 5/0003* (2013.01); *G01J 5/0007* (2013.01); *G01J 5/0275* (2013.01);
(Continued)

(58) Field of Classification Search
None
See application file for complete search history.

(56) References Cited

U.S. PATENT DOCUMENTS 5,318,362 A * 6/1994 Schietinger ........... G01J 5/0003
250/227.14
5,624,590 A * 4/1997 Fiory .................... G01J 5/0003
118/724

(Continued)

FOREIGN PATENT DOCUMENTS

WO   00/47962   8/2000
WO   2008/003080   1/2008

*Primary Examiner* — Mary Wilczewski
*Assistant Examiner* — Erik T Peterson
(74) *Attorney, Agent, or Firm* — Tarolli, Sundheim, Covell & Tummino LLP

(57) ABSTRACT

An apparatus and a method for determining the temperature of a substrate, in particular of a semiconductor substrate during the heating thereof by means of at least one first radiation source are disclosed. A determination of the temperature is based on detecting first and second radiations, each comprising radiation emitted by the substrate due to its own temperature and radiation emitted by the first radiation, which is reflected at the substrate and at least one of a drive power of the first radiation source and the radiation intensity of the first radiation source.

16 Claims, 7 Drawing Sheets

(51) Int. Cl.
  *G01J 5/00* (2006.01)
  *H01L 21/324* (2006.01)
  *G01J 5/10* (2006.01)
  *G01J 5/08* (2006.01)
  *G01J 5/02* (2006.01)

(52) U.S. Cl.
  CPC .............. *G01J 5/089* (2013.01); *G01J 5/0862* (2013.01); *G01J 5/10* (2013.01); *H01L 21/324* (2013.01); *H01L 21/67115* (2013.01); *H01L 21/67248* (2013.01)

(56) References Cited

U.S. PATENT DOCUMENTS

| | | | | |
|---|---|---|---|---|
| 5,641,419 | A | * | 6/1997 | Vandenabeele ......... G01J 5/602 219/497 |
| 6,835,914 | B2 | * | 12/2004 | Timans .................... F27B 5/04 118/50.1 |
| 6,849,831 | B2 | * | 2/2005 | Timans .................. C30B 31/12 118/50.1 |
| 2002/0066859 | A1 | | 6/2002 | Ino et al. |
| 2003/0166317 | A1 | * | 9/2003 | Blersch .............. G05D 23/1917 438/200 |
| 2003/0183612 | A1 | * | 10/2003 | Timans .................. C30B 31/12 219/390 |
| 2003/0236642 | A1 | * | 12/2003 | Timans ................ G01J 5/0003 702/99 |
| 2006/0027558 | A1 | * | 2/2006 | Hauf .................... G01J 5/0003 219/390 |
| 2006/0228897 | A1 | * | 10/2006 | Timans ............. H01L 21/67115 438/758 |
| 2008/0002753 | A1 | * | 1/2008 | Timans ................ G01K 11/125 374/2 |

* cited by examiner

DEVICE FOR DETERMINING THE TEMPERATURE OF A SUBSTRATE

RELATED APPLICATIONS

This application corresponds to PCT/EP2013/000807, filed Mar. 15, 2013, which claims the benefit of German Application No. 10 2012 005 429.9, filed Mar. 16, 2012, the subject matter of which is incorporated herein by reference in their entirety.

BACKGROUND OF THE INVENTION

The present invention relates to an apparatus for determining the temperature of a substrate, in particular a semiconductor substrate, as well as to an apparatus and a method for thermally treating substrates, in particular semiconductor substrates.

In the art, different apparatuses and methods for thermal treatment of substrates are known, as well as apparatuses for determining the temperature of a substrate during a thermal treatment thereof.

A known method for the thermal treatment of semiconductor substrates includes for example heating the substrate by means of electromagnetic radiation, which is emitted by lamps, such as tungsten halogen lamps. It is known to determine the temperature of the semiconductor wafer via a radiation detector directed onto the substrate for controlling the temperature of the thermal treatment. Since the radiation detector, however, typically not only detects radiation which is emitted from the semiconductor wafer but also radiation which is reflected by the semiconductor wafer or is transmitted there through, a differentiation of these different fractions of the radiation is required for determining the temperature.

For such a differentiation, U.S. Pat. No. 5,318,362, describes the so called Ripple technique, in which a frequency is impressed into the lamp radiation via a respective excitation of the lamp. This was initially achieved by utilizing the AC frequency of the power supply and this technique was refined over time and different frequencies were impressed. Changes in the temperature of the semiconductor wafer occur substantially slower in comparison to the impressed frequency. Thus, the radiation emitted by the semiconductor wafer due to its own temperature does not contain the frequency impressed onto the lamp radiation and may thus be differentiated there from.

For determining the temperature of the substrate with this technique, initially the emissivity of the substrate has to be determined and subsequently the temperature. The degree of emissions or emissivity of an object may depend on its temperature or process reactions and may change during the thermal treatment. Such a change may be gradual or erratic, and the change may be reversible or may be permanent. In particular, erratic changes may lead to an error in the determination of the temperature, if the change is detected too slowly or not at all. Calibration of an emissivity measurement is often difficult, since stable references are lacking. Furthermore, the emissivity of an object may also depend on the surroundings and may be different on the inside of a reactor compared to the outside thereof.

SUMMARY OF THE INVENTION

It is therefore an object of the present invention to provide an apparatus and a method for the thermal treatment of substrates, which, independent of the emissivity of the substrate, allows a radiation based determination of the temperature.

In accordance with the invention, this object is achieved by an apparatus for determining the temperature of a substrate in accordance with claim 1 and method for the thermal treatment of substrates in accordance with claim 10. Further embodiments of the invention will be come clear from the respective dependent claims and the following description.

In accordance with the invention, an apparatus for determining the temperature of a substrate, in particular of a semiconductor substrate during the heating thereof by means of at least one first radiation source, comprises: a first radiation detector, which is directed onto a first surface area of the substrate, which surface area faces towards the at least one radiation source, such that radiation emitted by the substrate and a first proportion of radiation of the at least one radiation source, which is reflected at the substrate, falls onto the first radiation detector, and a second radiation detector, which is directed onto a second surface area of the substrate, which second surface area faces to the at least one radiation source, such that radiation emitted by the substrate and optionally a second proportion of radiation of the at least one radiation source, which is reflected at the substrate, falls onto the radiation detector, wherein the first and second proportions of the radiation of the first radiation source, which is reflected at the substrate, which fall onto the respective radiation detectors, are different, and wherein the first and second surface areas are substrate areas having in substance the same temperature. Furthermore, a temperature determination unit is provided, which is capable of determining the temperature of the substrate directly by means of a power or radiation intensity of the first radiation source and the radiation detected by the first and second radiation detectors. Using two radiation detectors enables a direct determination of the temperature of the substrate by means of the detected radiation without knowing the emissivity of the substrate. The first and second radiation detectors may be formed by a single detector which is alternatively supplied with radiation coming from the substrate and having a first proportion of radiation reflected at the substrate and radiation coming from the substrate having a second proportion of radiation reflected at the substrate, wherein the second proportion may be zero or may approach zero.

Preferably, at least a third radiation detector is provided, which is directed onto the at least one first radiation source, in order to determine the radiation intensity of the first radiation source.

In one embodiment of the invention, the first and second surface areas are arranged in substance on a common circle with respect to a center point of the substrate. The term in substance as used herein encompasses all areas, which at least overlap in the area of the common circle, even if these areas are not centered with respect to the circle. This is supposed to ensure that the surface areas have in substance the same temperature. This may also be achieved by having the first and second surface areas arranged directly adjacent to each other or having the first and second surface areas at least partially overlapped. Preferably, the apparatus comprises at least one optical element, which influences the proportion of the radiation of the at least one radiation source, which is reflected at the substrate, wherein the at least one optical element may for example be an aperture and/or a filter. At least one optical element may be allocated to each radiation detector, wherein the optical elements may define different opening angles for a field of view of the radiation detectors and/or may be arranged at different distances from the substrate, in order to influence the proportion of the radiation of the at least one radiation source which is reflected at the substrate and reaches the respective radiation detector.

The apparatus may comprise at least one filter, which is arranged between at least one radiation source of a plurality of first radiation sources and the substrate, in order to filter out the radiation of the at least one radiation source, which is within the range of the measurement wave length of the radiation detector, before the radiation of the at least one radiation source impinges upon the substrate, In one embodiment the at least one first radiation source is a lamp, in particular a rod lamp.

The inventive method for thermally treating substrates, in particular semiconductor wafers, comprises: heating the substrate by means of a first radiation, which is emitted by at least a first radiation source, wherein the radiation of the first radiation source is directed onto a first side of the substrate and is at least partially reflected thereby. A first radiation coming from a first surface area of the first side of the substrate is detected, wherein the detected first radiation comprises at least a first substrate-radiation portion and a first reflection-radiation portion, wherein the first substrate-radiation portion consists of radiation emitted by the substrate due to its own temperature, and wherein the first reflection-radiation portion consists of radiation of the first radiation source, which is reflected at the substrate.

Furthermore, a second radiation is detected, which comes from a second surface area of the first side of the substrate, wherein the detected second radiation comprises at least on second substrate-radiation portion and a second reflection-radiation portion, wherein the second substrate-radiation portion consists of radiation emitted by the substrate due to its own temperature and the second reflection-radiation portion consists of radiation of the at least one first radiation source which is reflected at the substrate. The first and second surface areas are areas which comprise in substance the same temperature of the substrate, and the first and second reflection-radiation portions differ. On the basis of the first and the second detected radiations and the drive power of the at least one first radiation source and/or a radiation intensity of the same, the temperature of the substrate is determined. This is again possible directly using the previously mentioned values without first determining the emissivity of the substrate.

Preferably, the first and second radiations are detected with different radiation detectors, in order to enable simultaneous detection. However, they could also be detected in an alternate manner with the same radiation detector.

For homogenizing the substrate temperature in a rotation manner, the substrate is rotated around an axis extending in substance perpendicular to the first side, wherein the first and second surface areas are located in substance on a common circle of rotation with respect to a center point of the substrate. It is also possible—with or without rotation of the substrate—that the first and second surface areas are directly adjacent to each other or at least partially overlap.

In one embodiment, the first and/or second reflection-radiation portion is influenced by at least one optical element located between the substrate and the radiation detector for detecting the detected radiation.

In one embodiment, in the radiation path between the at least one radiation source of a plurality of first radiation sources and the substrate, radiation in the range of the measuring wave length of the radiation detector is filtered out before the radiation of the at least one radiation source falls onto the substrate, in order to influence the detected reflection-radiation portion.

Preferably, using a radiation detector, which is directed on the at least one first radiation source, the radiation intensity coming from the at least one radiation source is detected, wherein the result of this detection is used when determining the temperature of the substrate.

BRIEF DESCRIPTION OF THE DRAWINGS

The present invention will be described in more detail herein below with reference to the drawings. In the drawings:

FIG. 4 (b) is a curve, showing the expected progression of a pyrometer signal versus the drive power of heating lamps, the emitted radiation of which falls into the pyrometer by means of reflection at a wafer;

DESCRIPTION OF EMBODIMENTS

In the following description, terms such as above, below, left and right and similar expressions refer to the figures and are not to be seen in a limiting manner, even though they may refer to a preferred embodiment. The term "in substance" with respect to angles and arrangements is supposed to encompass deviations up to 10%, preferably up to 5% unless other indications are given. The term "in substance" when referring to other values is supposed to encompass deviations up to 10%, preferably up to 5%, unless other indications are made.

Figure 1:
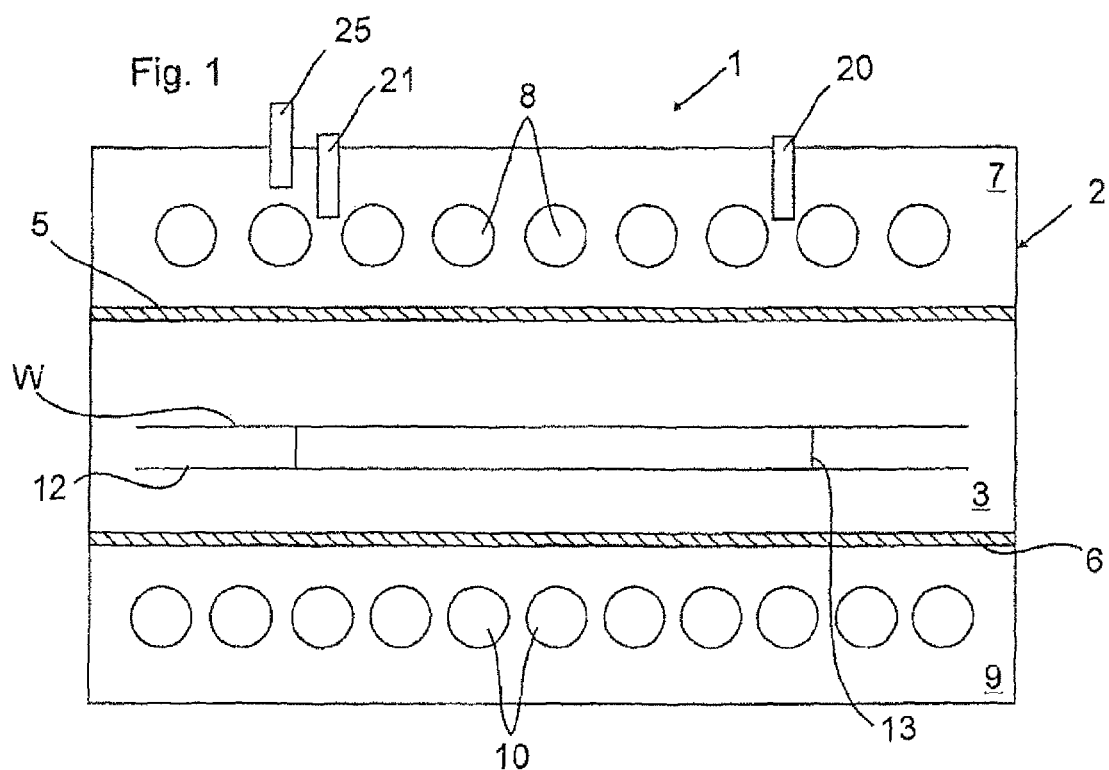
FIG. 1 is a schematic side sectional view through an apparatus for thermally treating semiconductor wafers.

FIG. 1 shows a schematic side section view of an apparatus 1 for the thermal treatment of semiconductor wafers W. The apparatus 1 comprises a housing 2 having an interior space, which inter alia forms a process chamber 3. The process chamber 3 is bounded on its upper and lower side by wall elements 5 and 6, respectively, and on its sides by the housing 2. Above the wall element 5 a lamp chamber 7 is provided within the housing 2. The lamp chamber 7 may have a mirrored surface and a heating source in the form of several lamps 8 may be provided. Below the wall element 6 another lamp chamber 9 similar to lamp chamber 7 is provided, in which a heat source in the form of several lamps 10 is provided.

The side walls of the process chamber 3 may also have a certain mirror effect for at least a portion of the electromagnetic radiation occurring within the process chamber 3. Furthermore, at least one of the side walls of the process chamber 3 has a process chamber door (not shown) for loading and unloading the semiconductor wafers W. Furthermore, gas inlets and gas outlets (not shown) for the process chamber 3 may be provided.

Within the process chamber 3 a substrate holder 12 having supports 13 is provided, onto which the semiconductor wafer W is placed. The substrate holder 12 is connected to a rotation mechanism, in order to rotate a semiconductor wafer W received on the substrate holder 12 around an axis, which is in substance perpendicular to the upper surface of the semiconductor wafer W. Hereby, as is known in the art, temperature differences on the semiconductor wafer are to be balanced. Within the process chamber 3 a compensation ring which radically surrounds the semiconductor wafer is provided as is known in the field of RTP-systems.

The wall elements 5 and 6, which bound the process chamber 3 on the top and the bottom are made of quartz and are in substance transparent to the radiation of the lamps 8 and 10, respectively.

The lamps 8 and 10 may be so-called flash lamps, which are typically operated in a flash mode, or tungsten halogen lamps, which are typically operated in a continuous mode. The lamps may also be arranged in a different manner and it is also possible to combine the above mentioned lamp types or to combine the above with other lamp types. In particular, it is also possible to dispense with the lamps 10 and to provide only an upper lamp chamber 7 having lamps 8 or to dispense with the upper lamp chamber 7 and the lamps 8 and to only provide the lower lamp chamber 9 having lamps 10.

The apparatus 1 further comprises a first pyrometer, which is directed onto the upper side of the semiconductor wafer W, which is called the first substrate pyrometer 20 in the following, as well as a second pyrometer, which is directed onto the upper side of the semiconductor wafer W, which will be called the second substrate pyrometer 21 in the following. Furthermore, a third pyrometer, which is directed onto at least one of the lamps 8 is proved, which will be called the lamp pyrometer 25 in the following. Optionally, a pyrometer may be provided which is directed onto the back side of the semiconductor wafer W, i.e. a pyrometer which is directed onto the side of the semiconductor wafer W opposite to the lamps 8, in order to allow a transmission of radiation through the semiconductor wafer W to be taken into account.

Figure 2:
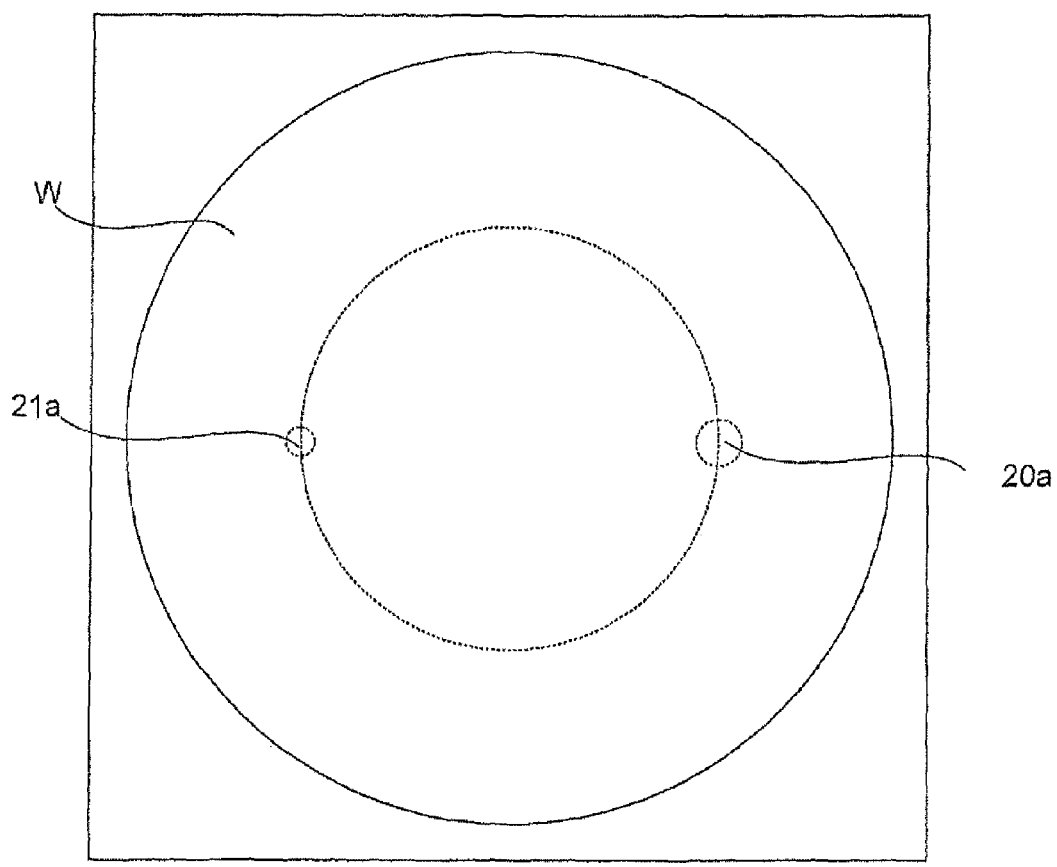
FIG. 2 is a schematic top view onto a semiconductor wafer.

The first substrate pyrometer 20 and the second substrate pyrometer 21 are directed onto the upper side of the semiconductor wafer W in such a manner, that they are directed onto surface areas 20*a*, 21*a* having the same temperature. When having a rotating semiconductor wafer W, the first and second surface areas 20*a*, 21*a* may lay in substance on a common circle of rotation with respect to a center point of the semiconductor wafer W. Hereby, the term in substance is supposed to encompass an at least partial overlap of the surface areas 20*a*, 21*a* in a direction of rotation. Such an arrangement is for example shown in the view of FIG. 2. The surface areas 20*a*, 21*a* could also be arranged directly adjacent to each other or in an overlapping manner in order to ensure that the semiconductor wafer W has the same temperature in the surface areas 20*a*, 21*a*.

In accordance with FIG. 1, the first substrate pyrometer 20 and the second substrate pyrometer 21 are shown such that they extend into the upper lamp chamber and are directed in a perpendicular manner from above onto the semiconductor wafer W. It would also be possible to mount the first and second substrate pyrometers on a side of housing 2 and to direct the same onto the semiconductor wafer W from the side. For example, the first and second substrate pyrometers 20, 21 could also be directed onto the upper side of the semiconductor wafer W via a light guide, which could extend in a shielded manner into or through the lamp chamber 7 and a corresponding opening in the upper wall 5.

Figure 3:
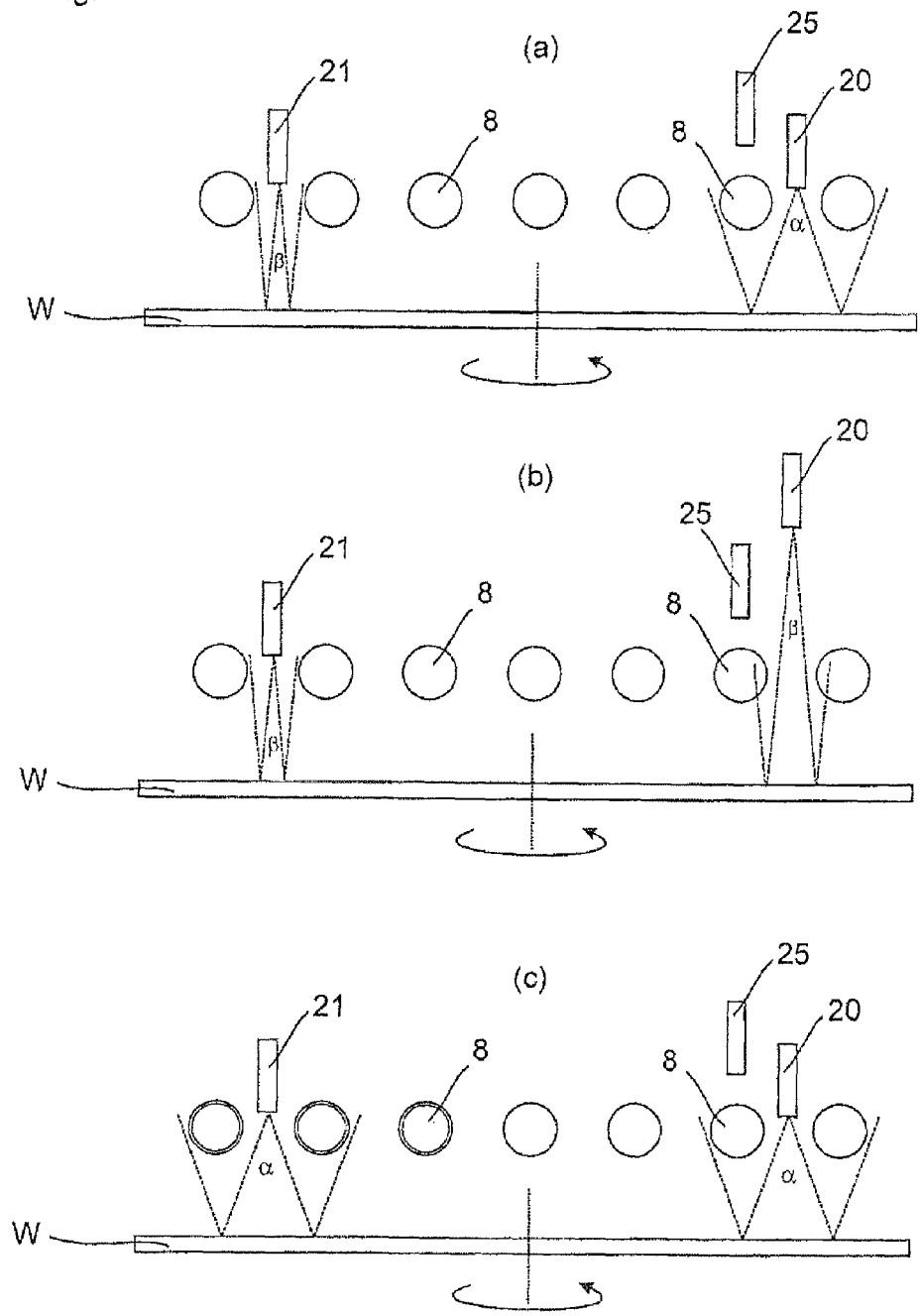
FIG. 3 (a) to (c) are schematic side views of different arrangement possibilities for a substrate pyrometer with respect to a bank of lamps.

The first and second substrate pyrometers 20, 21 are thus capable of detecting radiation coming from the semiconductor wafer W. This radiation coming from the substrate includes radiation emitted by the substrate, which is called substrate-radiation in the following, as well as typically radiation coming from the lamps 8, which are reflected at the semiconductor wafer W, which radiation is called reflection-radiation in the following. The radiation detected at the respective first and second substrate pyrometers 20, 21 differs with respect to the composition of the portions of the substrate-radiation and the reflection-radiation. This may be achieved in different manners, as will be explained herein below with respect to FIG. 3. Hereby it is possible, that the portion of the reflection-radiation, which is measured at one of the substrate pyrometers 20, 21 is zero or almost zero.

In accordance with FIG. 1, the lamp pyrometer 25 is shown extending into the upper lamp chamber and being directed from above in a perpendicular manner onto one of the lamps 8 of the upper bank of lamps. It would also be possible, to mount the lamp pyrometer 25 on a side of the housing 2 and to direct the same from the side onto one of the lamps 8.

FIGS. 3*a* to *c* show schematic side views of different alternatives of arranging the substrate pyrometers 20, 21 and the lamp pyrometer 25 with respect to the semiconductor wafer W and the lamps 8 of the upper bank of lamps.

In all of the alternatives, the substrate pyrometers 20, 21 are directed onto the upper side of the semiconductor wafer W through a gap between adjacent lamps 8 of the upper bank of lamps hereby, the substrate pyrometers 20, 21 are each arranged such that in substance no direct radiation of the lamps 8 can be detected, which may for example be achieved by a corresponding opening of an aperture of the substrate pyrometers 20, 21. In the different alternatives, a field of view of the substrate pyrometers 20, 21 is indicated by a dashed line.

In each alternatives, furthermore the lamp pyrometer 25 is directed onto a lamp 8 which is adjacent to substrate pyrometer 20 so that the lamp pyrometer 25 may detect radiation of a lamp 8, which via reflection may also be detected by substrate pyrometer 20, as will be explained in more detail herein below.

In the alternative according FIG. 3*a* the substrate pyrometer 20 has a field of view on the semiconductor wafer W, which is defined by an opening angle α and the distance of the substrate pyrometer 20 to the semiconductor wafer W. The opening angle α is chosen with respect to the position of the substrate pyrometer 20 such that a single reflected radiation of the lamps 8, which are arranged adjacent to the substrate pyrometer 20 may fall into the substrate pyrometer 20 and is detected hereby.

The substrate pyrometer 21 has a field of view on the semiconductor wafer W, which is defined by an opening angle β and the distance of the substrate pyrometer 21 to the semiconductor wafer W. The opening angle β is chosen with respect to the position of the substrate pyrometer 21 such that no radiation of the lamps 8 may fall into the substrate pyrometer 21 via a single reflection. In explaining the above alternative, only a single reflection of the lamp radiation is taken into consideration. Obviously, via multiple reflections (further) lamp radiation may fall into the respective substrate pyrometer 20, 21. This may, however, in substance be neglected in the following, since the corresponding portion of the radiation, which enters the substrate pyrometer 20 or 21 via multiple reflections is relatively small.

As will be clear from the above explanation and FIG. 3*a*, the substrate pyrometers 20, 21 measure in substance the same substrate-radiation but different portions of the reflection-radiation. At the substrate pyrometer 21 in substance no or only a very small portion of reflection-radiation is measured, while at the substrate parameter 20, depending on the intensity of the lamps 8, a substantial portion may be measured.

In the alternative according to FIG. 3*b*, the substrate pyrometers 20, 21 each have a field of view on the semiconductor wafer W, which is defined by the same opening angle 13 but different distances of the substrate pyrometers 20, 21 to the semiconductor wafer W. The substrate pyrometer 20 is arranged with a larger distance with respect to the top surface of the semiconductor wafer W than the substrate pyrometer 21. Hereby it is possible, that radiation of the lamps 8 may fall into the substrate pyrometer 20 via a single reflection, while this is not possible with respect to substrate pyrometer 21, as shown in FIG. 3*b*. Thus, it is again possible that the substrate pyrometers 20, 21 measure the same substrate-radiation but different portions of the reflection-radiation.

FIG. 3*c* shows a further alternative of arranging the substrate pyrometers 20, 21. In this alternative the substrate pyrometers 20, 21 each have a field of view of the semiconductor wafer W which is defined by the same opening angle $\alpha$ and the same distances of the respective substrate pyrometers 20, 21 to the semiconductor wafer. Thus, the same portions of reflection-radiation would fall into the respective substrate pyrometers 20, 21. In the vicinity of the substrate pyrometer 21, however, the lamps 8 are surrounded by a filter element, which filters the lamp radiation in the range of the measuring wave length of the substrate pyrometer 21. Thus, generally reflection-radiation of the lamps 8 may fall into the substrate pyrometer 21, but this radiation is outside of the measuring wave length range of the substrate pyrometer 21, such that the substrate pyrometer 21 detects a different portion of reflection-radiation compared to the substrate pyrometer 20.

In operation, an evaluation circuit (not shown) may be connected to the substrate pyrometers 20, 21 and the lamp pyrometer, which may directly determine the temperature of the semiconductor wafer W from the detected radiations, as will be explained in more detail herein below. Furthermore, also the emissivity of the semiconductor wafer W may be determined on the basis of the detected radiations.

During operation, the semiconductor wafer W is heated via the lamps 8 and optionally via the lamps 10. The substrate pyrometers 20, 21 detect the radiation coming from the semiconductor wafer W, which, as explained above, contains the substrate-radiation and where applicable the reflection-radiation. Furthermore, the detected radiation may also contain transmission components, which, however, are not taken into consideration in the following description. The lamp pyrometer 25 detects the lamp radiation of at least one of the lamps 8. The lamp radiation may optionally comprise a modulation as is known in the art, in order to make it distinguishable from the substrate-radiation. Such a modulation is not needed for temperature determination, but it may provide additional information.

The typical pyrometric temperature measurement is based on measuring the intensity of the thermal radiation of an object at a predetermined wave length. For a black body radiator having the temperature T, the thermal radiation power $P_{bb}$ which is emitted from an area dA within the wave length range between $\lambda$ and $\lambda+d\lambda$ in the entire half space is given by the Planck formula:

$$\frac{dP_{bb}(T,\lambda)}{dAd\lambda} = \frac{C_1}{\lambda^5(e^{C_2/(\lambda T)}-1)}$$

wherein $$C_1 = 2\pi hc^2 = 3{,}742 * 10^8 \frac{W\mu m^4}{m^2}$$

and $$C_2 = \frac{hc}{k} = 14388 \ \mu mK$$

For a real object, the radiation is less than the radiation of a black body radiator:

$$\frac{dP(T,\lambda)}{d\lambda} = \varepsilon(T,\lambda)\frac{dP_{bb}(T,\lambda)}{dAd\lambda}$$

wherein $\epsilon$ represents the emissivity of the object, wherein $0<\epsilon<1$. This is dependent on the wave length and the angle of view and also often changes with the temperature of the object. Furthermore, it may also be dependent on the situation such that the emissivity of an object in a reflecting chamber may for example be higher compared to the same object in a free space.

For a temperature measurement of an object based on its radiation at a certain wave length, typically the emissivity of the object at the wave length and the angle of view onto the object have to be known. The direct emissivity at a wave length is the same as the direct absorption at the wave length in accordance with Kirchhoff's law such that $\epsilon=1-\rho-\tau$, wherein $\rho$ is the reflectivity and $\tau$ is the transmissivity.

In the apparatus of the above referenced type, the substrate pyrometer 20 measures substrate-radiation as well as reflection-radiation. Assuming that no directed lamp radiation may fall into the substrate pyrometer, multiple reflections are not taken into consideration and at the measuring wave length of the substrate pyrometer 20 no transmission occurs, the signal $S_{20}$ of the substrate pyrometer 20 may be represented as follows:

$$S_{20}=a\epsilon P_{bb}(T)+b\rho L(P)$$

wherein $P_{bb}(T)$ is the black body radiation corresponding to the wafer temperature T in accordance with the Planck's formula, $\epsilon$ is the emissivity of the wafer surface and L(P) is the lamp radiation at the measuring wave length, when the lamps are operated with a predetermined power P. $\rho$ is the reflectivity of the wafer surface and a and b are constants, which depend on the field of view of the pyrometer, the chamber geometry and other parameters.

Without transmissivity, the reflectivity is $\rho=1-\epsilon$, such that the pyrometer signal may be represented as follows:

$$S_{20}=a\epsilon P_{bb}(T)+b(1-\epsilon)L(P)=(aP_{bb}(T)-bL(P))\epsilon+bL(P)$$

Figure 4:
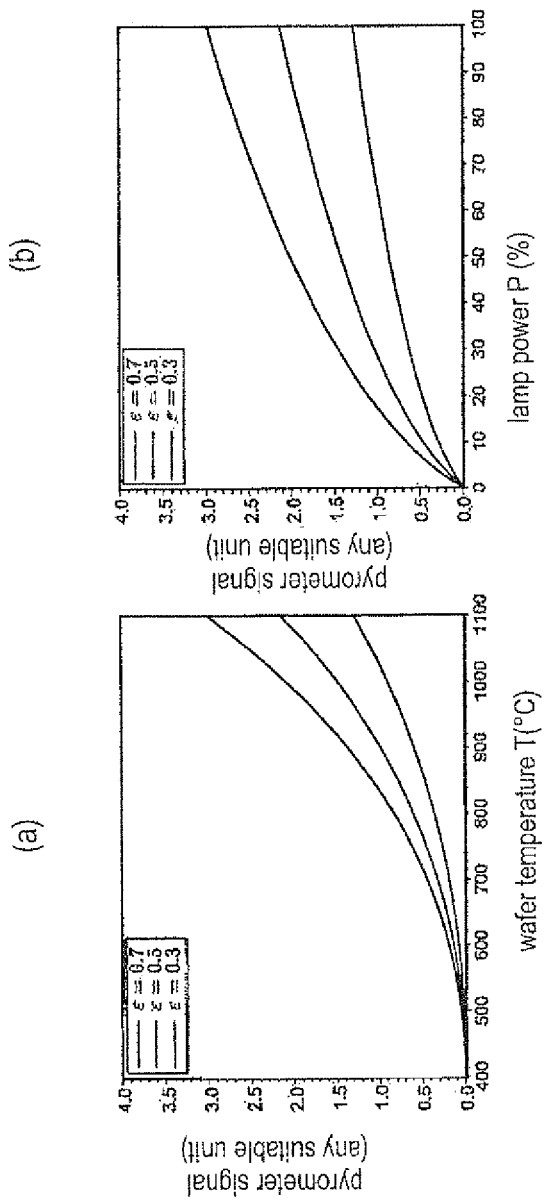
FIG. 4 (a) is a curve of the expected progression of a pyrometer signal versus the radiation of the wafer due to its own temperature.

When assuming in the above referenced apparatus that the lamps 8 are tungsten halogen lamps and the substrate pyrometer has a measuring wave length of 2.3 µm, then the influence of the substrate-radiation and the reflection-radiation in the signal of the substrate pyrometers may be represented as shown in FIG. 4(a) and FIG. 4(b). Here FIG. 4(a) shows the progression of the pyrometer signal versus the temperature of the wafer for the substrate-radiation alone (lamps off) and FIG. 4(b) shows the progression of the pyrometer signal versus the lamp power in percentage for the pure reflection-radiation (wafer temperature=0). Both, FIGS. 4(a) and 4(b) show the progression for different emissivities $\epsilon$ of a semiconductor wafer W.

Figure 5:
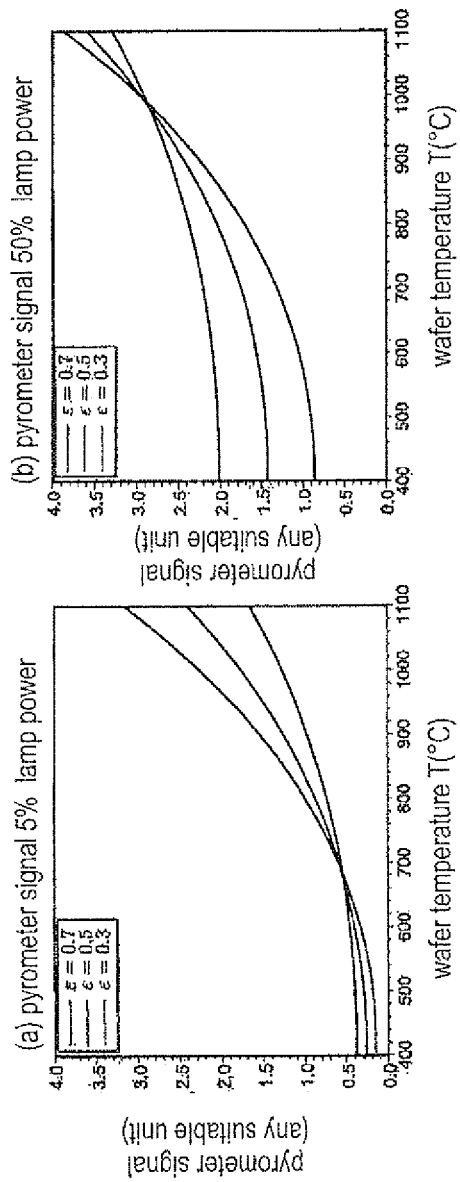
FIGS. 5 (a) and 5 (b) are curves showing the expected progression of a pyrometer signal versus the temperature of a wafer, wherein the pyrometer detects both temperature radiation of the wafer as well as radiation of the heating lamps reflected at the wafer, the heating lamps being driven with a constant lamp power, wherein FIG. 5 (a) shows the expected progression of the pyrometer signal at a lamp power of 5% and FIG. 5 (b) shows the expected progression of the pyrometer signal at a lamp power of 50%.

The FIGS. 5(a) and 5(b) show the expected progression of the pyrometer signals versus the temperature of the wafer, detecting both, the substrate-radiation as well as the reflection-radiation. Here, FIG. 5(a) shows the expected progression of the pyrometer signal at a lamp power of 5% and FIG. 5(b) shows the expected progression of the pyrometer signal at a lamp power of 50%, each for respective different emissivities $\epsilon$ of a semiconductor wafer W.

As can be seen at the crossings of the curves in FIGS. 5(a) and 5(b), for each lamp power, there is a wafer temperature, at which the pyrometer signal is independent of the emissivity $\epsilon$ of the semiconductor wafer W. These crossings define the working temperature of a pyrometer and the temperature may be expressed as follows:

$$aP_{bb}(T_P(P))=bL(P)$$

At this temperature, the pyrometer signal is:

$$S=bL(P)=aP_{bb}(T_P(P))$$

Figure 6:
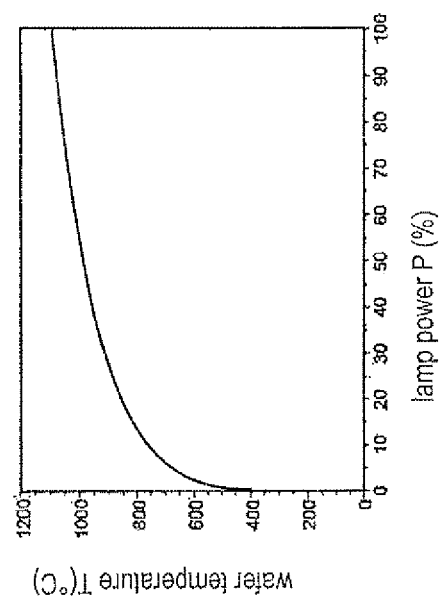
FIG. 6 is a curve of the expected working temperatures of a pyrometer as a function of the lamp power.

FIG. 6 shows a curve of working temperatures of a pyrometer as a function of the lamp power. Each time the wafer temperature crosses this curve and a corresponding lamp power P, the temperature is directly known without knowing the emissivity $\epsilon$ of the semiconductor wafer.

In the field, typically the lamp power P is not the one holding the semiconductor wafer W at a constant temperature $T_P$. Thus, different lamp powers for a process operation on the one side and a measurement on the other side would be advantageous. It would for example be possible for a measurement to rapidly but continuously change the lamp power. Hereby, the point could be determined, at which the lamp power and the pyrometer signal match the line according to FIG. 6, which would allow a direct temperature determination. Subsequently, the lamp power could again be controlled for normal process operation. If such change of the lamp power is possible fast enough, without influencing the temperature of the semiconductor wafer, a direct temperature measurement using only one substrate pyrometer would be possible.

Preferably, both of the above described substrate pyrometers 20, 21 are used for a temperature measurement, wherein the different portions of the measured reflection-radiation allow a direct temperature measurement, as described herein below.

Figure 7:
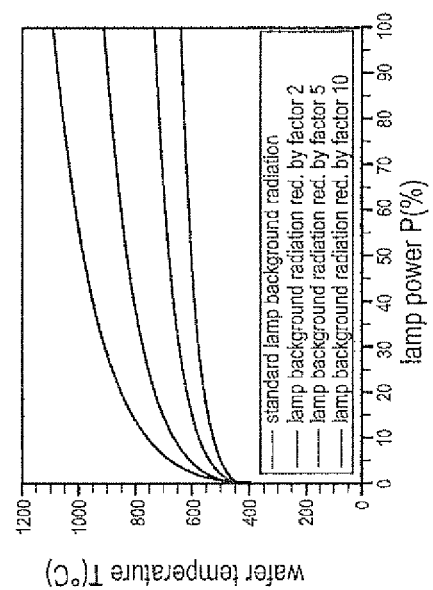
FIG. 7 shows different curves of the expected working temperatures of a pyrometer as a function of the lamp power, wherein the different curves are based on detecting different portions of reflected radiation of the heating lamps at the pyrometer.

FIG. 7 shows different curves of the working temperature (corresponding to FIG. 6) of a pyrometer for different portions of the reflection-radiation at a constant substrate-radiation. The upper curve shows the working temperature for the normally expected reflection-radiation. The lower curve corresponds to a reduction of the expected reflection-radiation by the factor 2.5 and 10, respectively.

Two substrate pyrometers, which detect different portions of reflection-radiation with a constant substrate-radiation allow a direct temperature determination on the different curves of the respective working temperatures. Furthermore, a weighted sum of two pyrometer signals, which contain in a known manner different portions of reflection-radiation may be used, to emulate a virtual pyrometer, which has a working point at the current wafer temperature.

Mathematically the pyrometer signals of the substrate pyrometers 20, 21 may be expressed as follows:

$$S_{20}=a_{20}\epsilon P_{bb}(T)+b_{20}(1-\epsilon)L(P)$$

and $$S_{21}=a_{21}\epsilon P_{bb}(T)+b_{21}(1-\epsilon)L(P)$$

Here, $S_{20}$ is the pyrometer signal of the substrate pyrometer 20, $a_{20}$ is a constant, which takes into consideration an amplification factor of the wafer radiation at the substrate pyrometer 20, and $b_{20}$ is a constant, which takes into consideration an influence of the reflection-radiation at the substrate pyrometer 20. Correspondingly, $S_{21}$ is the pyrometer signal of the substrate pyrometer 21, $a_{21}$ is a constant, which takes into consideration an amplification factor of the wafer radiation at the substrate pyrometer 21, and $b_{21}$ is a constant, which takes into consideration an influence of the reflection-radiation at the substrate pyrometer 21. The influence of the reflection-radiation is determined by the portions of substrate-radiation and reflection-radiation, which as is known differ at the substrate pyrometers.

Rearranging the above formulas leads to:

$$P_{bb}(T)=\frac{(b_{21}S_{20}-b_{20}S_{21})L(P)}{a_{21}S_{20}-a_{20}S_{21}+(a_{20}b_{21}-a_{21}b_{20})L(P)}$$

and $$\varepsilon=1-\frac{a_{21}S_{20}-a_{20}S_{21}}{(a_{21}b_{20}-a_{20}b_{21})L(P)}$$

For these formulas there is always one solution, as long as both substrate pyrometers detect a signal which is not zero and contains different portions of the reflection-radiation. Hereby the calculated emissivity is an in-Situ emissivity, which is only valid within the chamber and within the linear model.

In reality, the pyrometer signals $S_{20}$ and $S_{21}$ will also be influenced by other factors, which are not shown in the above equation. Furthermore, multiple reflections of the lamp radiation, which may fall into the pyrometer, can also influence the equation. Furthermore, a simple relationship between the lamp power and the expected lamp radiation is not necessarily exact when the lamp power changes rapidly. Therefore, it may be advantageous to directly determine the lamp radiation, which may be achieved by the lamp pyrometer 25. Instead of the lamp power, the measurement of the lamp pyrometer may be incorporated into the above equations. This measurement may also be supported by a model, which is based on the lamp power, in order to take into consideration influences of more distant lamps.

The curves of the working temperatures according to FIG. 6 are based on a simple model and the real curves will differ from the shown ones. Rather than enhancing the model, it may be advantageous to determine the curves by a calibration routine. Here, different calibration runs with at least two wafers having different emissivities are required. A calibration run consists of a sequence of different constant lamp powers or preferably constant lamp radiation, which is measured by the lamp pyrometer.

A constant lamp power or lamp radiation leads to the wafer asymptotically approaching an equilibrant temperature. This equilibrant temperature is higher than the working temperature of the pyrometer for high lamp power or lamp radiation and is lower than the working temperature of the pyrometer for lower lamp power or lamp radiation. If one starts at a low wafer temperature and a high lamp power or lamp radiation, the wafer temperature will cross the curve according to FIG. 6. Reducing the lamp power or lamp radiation now leads to the wafer temperature falling below the curve according to FIG. 6. A sequence may be set in which the temperature crosses the curve multiple times at different positions, in order to obtain the complete curve. If this sequence is run with both wafers (having different emissivities), the real position of the curve of the working temperatures may be determined.

This calibration may be performed for both substrate pyrometers if they have different working temperatures. As previously mentioned, the real temperature of the wafer will seldom lay on one of the calibrated curves of working temperatures. However, a virtual pyrometer $S_v$ may be emulated by a weighted sum of the two pyrometers signals as follows:

$$S_v = \alpha S_{20} + (1-\alpha) S_{21}$$

For each virtual pyrometer, which is determined by the value of $\alpha$, a respective calibration of the curve of the working temperatures may be performed in a corresponding manner, as was done for the real pyrometer. This would appear to be advantageous for a limited number of virtual pyrometers. For the real temperature measurement, the temperature values which are not covered by the curves may then be obtained by interpolation of the curves of the working temperatures.

The invention was previously described with respect to preferred embodiments of the invention without being limited to these embodiments. For example, more than two substrate pyrometers may be used or a single substrate pyrometer may be used, wherein for example via a movable aperture, the field of view on the semiconductor wafer and thus, the portion of the reflection-radiation, which falls into the substrate pyrometer may be constantly changed in a known manner. Hereby, two pyrometers having different portions of reflection-radiation are simulated. It is also possible to provide two pyrometers, which from different positions are directed onto the same area of the substrate, such that one of the pyrometers will see the reflected image of the lamp on the substrate surface, while the other will not. In three dimensions this can also be achieved at the same opening angle and the same angle of incidence onto the substrate surface. The two surface areas of the substrate may in this case be exactly the same such that it is ensured, that the surface areas both have the same temperature and the same emissivity even without rotation. In a further alternative for arranging the pyrometers, one of the pyrometers may be directed onto the substrate through a tube, which may optionally be at least partially reflective, wherein the tube extends to a position close to the substrate surface. At a suitable (small) opening angle of the pyrometer, the pyrometer is thus moved optically closer to the substrate. A pyrometer having a tube and one parameter having no tube, for example arranged on a common circle of radiation then forms the required combination of different portions of reflection-radiation. These embodiments are explicitly to be covered by the following claims.

The features of individual embodiments may freely be combined with or exchanged with features of the other embodiments, as long as they are compatible. In particular, an apparatus may be formed, the alternative of arranging the substrate pyrometers with different opening angles, different distances to the wafer and/or filters may be combined.

The invention claimed is:

1. An apparatus for determining the temperature of a substrate (W), in particular of a semiconductor substrate during the heating thereof by means of at least one first radiation source (8), the apparatus comprising:
    a first radiation detector (20), which is directed onto a first surface area of the substrate (W), which surface area faces towards the at least one first radiation source (8), such that radiation emitted by the substrate and a first proportion of radiation of the at least one first radiation source, which is reflected at the substrate, falls onto the first radiation detector,
    a second radiation detector (21), which is directed onto a second surface area of the substrate (W), which second surface area faces to the at least one first radiation source, such that radiation emitted by the substrate and optionally a second proportion of radiation of the at least one first radiation source, which is reflected at the substrate, falls onto the second radiation detector, wherein the first and second proportions of the radiation of the at least one first radiation source, which is reflected at the substrate, which fall onto the respective radiation detectors, are different, and wherein the first and second surface areas are substrate areas having in substance the same temperature; and
    a temperature determination unit, which is configured to determine the temperature of the substrate directly by means of the radiation detected by the first and second radiation detectors and at least one of a drive power of the at least one first radiation source and a radiation intensity of the at least one first radiation source.

2. The apparatus of claim 1, further comprising:
    a third radiation detector (25), which is directed onto the at least one first radiation source (8), in order to determine the radiation intensity of the at least one first radiation source.

3. The apparatus of claim 1, wherein the first and second surface areas are arranged in substance on a common circle with respect to a center point of the substrate.

4. The apparatus of claim 1, wherein the first and second surface areas are arranged directly adjacent to each other or at least partially overlap.

5. The apparatus of claim 1, further comprising at least one optical element, which influences the proportion of the radiation of the at least one first radiation source, which is reflected at the substrate, wherein the at least one optical element is arranged between the substrate and at least one of the radiation detectors.

6. The apparatus of claim 5, wherein the at least one optical element is at least one of an aperture and a filter.

7. The apparatus claim 5, wherein at least one optical element is allocated to each radiation detector, wherein the optical elements define different opening angles for a field of view of the radiation detectors and/or are arranged at different distances from the substrate, in order to influence the proportion of the radiation of the at least one first radiation source which is reflected at the substrate and reaches the respective radiation detector.

8. The apparatus of claim 1, comprising at least one filter, which is arranged between the at least one first radiation source and the substrate, in order to filter out the radiation of the at least one first radiation source, which is within the range of the measurement wavelength of the radiation detector, before the radiation of the at least one first radiation source impinges upon the substrate.

9. The apparatus of claim 1, wherein the at least one first radiation source is a lamp.

10. A method for thermally treating substrates, in particular semiconductor wafers, the method comprising:
heating the substrate by means of a first radiation, which is emitted by at least one first radiation source, wherein the radiation of the at least one first radiation source is directed onto a first side of the substrate and is at least partially reflected thereby,
detecting a first radiation coming from a first surface area of the first side of the substrate, wherein the detected first radiation comprises at least a first substrate-radiation portion and a first reflection-radiation portion, wherein the first substrate-radiation portion consists of radiation emitted by the substrate due to its own temperature, and wherein the first reflection-radiation portion consists of radiation of the at least one first radiation source, which is reflected at the substrate,
detecting a second radiation, which comes from a second surface area of the first side of the substrate, wherein the detected second radiation comprises at least one second substrate-radiation portion and a second reflection-radiation portion, wherein the second substrate-radiation portion consists of radiation emitted by the substrate due to its own temperature and the second reflection-radiation portion consists of radiation of the at least one first radiation source which is reflected at the substrate, wherein the first and second surface areas are areas which comprise in substance the same temperature of the substrate, and wherein the first and second reflection-radiation portions differ,
determining the temperature of the substrate on the basis of the first and the second detected radiations and at least one of the drive power of the at least one first radiation source and a radiation intensity of the at least one first radiation source.

11. The method of claim 10, wherein the first and second radiations are detected with different radiation detectors.

12. The method of claim 10, wherein the substrate is rotated around an axis extending in substance perpendicular to the first side, wherein the first and second surface areas are located in substance on a common circle of rotation with respect to a center point of the substrate.

13. The method of claim 10, wherein the first and second surface areas are directly adjacent to each other or at least partially overlap.

14. The method of claim 10, wherein at least one of the first and second reflection-radiation portions is influenced by at least one optical element located between the substrate and a radiation detector for detecting the reflected radiation.

15. The method of claim 10, wherein radiation in the range of the measuring wavelength of a radiation detector is filtered out in the radiation path between the at least one first radiation source and the substrate, before the radiation of the at least one first radiation source falls onto the substrate, in order to influence the respective detected reflection-radiation portion.

16. The method of claim 10, wherein the radiation intensity coming from the at least one first radiation source is detected using a radiation detector, which is directed onto the at least one first radiation source, wherein the result of this detection is used when determining the temperature of the substrate.

* * * * *